(12) United States Patent
Chan et al.

(10) Patent No.: US 7,082,490 B2
(45) Date of Patent: Jul. 25, 2006

(54) METHOD AND SYSTEM FOR ENHANCING THE ENDURANCE OF MEMORY CELLS

(75) Inventors: Johnny Chan, Fremont, CA (US);
Philip S. Ng, Cupertino, CA (US);
Tinwai Wong, Fremont, CA (US)

(73) Assignee: Atmel Corporation, San Jose, CA (US)

( * ) Notice: Subject to any disclaimer, the term of this patent is extended or adjusted under 35 U.S.C. 154(b) by 439 days.

(21) Appl. No.: 10/690,082

(22) Filed: Oct. 20, 2003

(65) Prior Publication Data

US 2005/0086440 A1    Apr. 21, 2005

(51) Int. Cl.
*G06F 12/00* (2006.01)
(52) U.S. Cl. .................. 711/103; 711/103; 711/156; 711/154; 365/185.33
(58) Field of Classification Search ............... None
See application file for complete search history.

(56) References Cited

U.S. PATENT DOCUMENTS

| | | | |
|---|---|---|---|
| 4,803,707 A | 2/1989 | Cordan, Jr. ............ 377/24.1 |
| 4,807,188 A | 2/1989 | Casagrande ............ 365/182 |
| 5,367,484 A | 11/1994 | Alexander et al. ........ 365/185 |
| 5,710,734 A | 1/1998 | Park .................. 365/185.09 |
| 5,793,684 A | 8/1998 | Yach ..................... 365/200 |
| 5,963,970 A | 10/1999 | Davis ..................... 711/103 |
| 6,000,006 A | 12/1999 | Bruce et al. ............. 711/103 |
| 6,081,447 A | 6/2000 | Lofgren et al. ........ 365/185.02 |
| 6,157,570 A | 12/2000 | Nachumovsky ........ 365/185.18 |
| 6,160,738 A | 12/2000 | Atsumi et al. ........ 365/185.25 |
| 6,230,233 B1 | 5/2001 | Lofgren et al. ............ 711/103 |
| 6,400,634 B1 | 6/2002 | Liou et al. ............ 365/230.03 |
| 6,493,269 B1 | 12/2002 | Cernea ................ 365/185.28 |
| 6,539,453 B1 | 3/2003 | Guterman ................ 711/103 |
| 2002/0184432 A1 | 12/2002 | Ban ..................... 711/102 |

*Primary Examiner*—Kevin Verbrugge
*Assistant Examiner*—Mehdi Namazi
(74) *Attorney, Agent, or Firm*—Schneck & Schneck; Thomas Schneck

(57) ABSTRACT

An integrated circuit device includes a plurality of non-volatile memory cells associated with a plurality of flag cells storing managing data. The managing data of the flag cells forms a data set. The data set is utilized to determine to which memory cell of the plurality of memory cells to write new data and from which of the memory cells to read currently stored data. The data set is changed to a different data set whenever a new value is written to a designated memory cell to indicate an alternate memory cell to be written to next and an alternate memory cell to be read from next. The data set may be changed by alternately writing a new value to a different flag cell in each successive change of the data set.

58 Claims, 3 Drawing Sheets

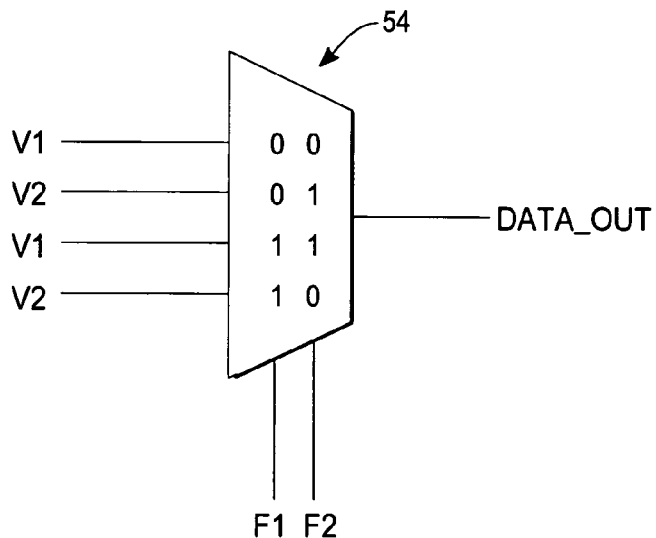
*Fig. 3A*
| CURRENT F1 F2 | READ FROM | ERASE/ WRITE TO | NEXT F1 F2 |
|---|---|---|---|
| 0 0 | V1 | V2 | 0 1 |
| 0 1 | V2 | V1 | 1 1 |
| 1 1 | V1 | V2 | 1 0 |
| 1 0 | V2 | V1 | 0 0 |
*Fig. 3C*
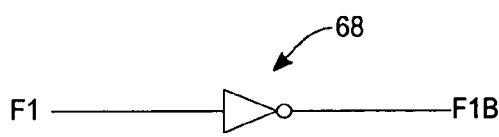
*Fig. 3D*
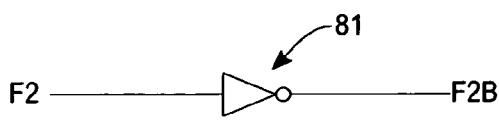
*Fig. 3E* ord# METHOD AND SYSTEM FOR ENHANCING THE ENDURANCE OF MEMORY CELLS

FIELD OF THE INVENTION

The invention pertains to non-volatile semiconductor memory, and in particular, to methods and circuit arrangements for increasing the endurance of non-volatile memory cells.

BACKGROUND OF THE INVENTION

Computer systems, or other data processing systems, include integrated circuit devices having a subset of memory in which data is changed more often than data in other subsets of the memory. The subset of memory that is more frequently changed tends to fail to due the effects of the great number of change cycles it undergoes.

A wide variety of endurance enhancement techniques are known to attempt to decrease the potential for failure of the memory cells. For example, redundant memory cells are provided so that if one memory cell fails, another memory cell will take over and provide the required data. Also wear leveling techniques are known in the art.

Most endurance enhancement techniques operate at the block level rather than the bit level. Counters are often used to keep track of the total number of erase/program cycles of a block and then to switch to a redundant block before the first block fails or to occasionally switch blocks to even out the wear.

In U.S. Pat. No. 6,000,006 to Bruce et al., a total-write-counter field indicates a total number of write-erase cycles of the block and an incremental-write-counter field indicates an incremental number of write-erase cycles since a wear-leveling operation for the block. The total and incremental numbers must exceed thresholds for wear leveling for the block change to occur.

Some techniques operate at the bit level. For example, U.S. Pat. No. 4,803,707 to Cordan, Jr. uses an extra memory cell as a backup and writes to both memory cells each time a writing operation is to occur. If one cell fails, the other cell ensures that the data is not lost. However, overall endurance is only marginally improved, since both cells wear at about the same rate.

U.S. Pat. No. 6,157,570 to Nachumovsky reduces wear by avoiding unnecessary erasing of unchanged bits when a new byte is to be written. Since, on average, only one-half of the bits have changes, endurance is doubled. However, a byte write operation is considerably more complicated, because for each bit the existing and new states must first be compared, then a decision made as to whether it needs to be programmed.

It is an object of the present invention to provide a method and system to enhance the endurance of a memory cell or memory cells of an integrated circuit at the bit level.

It is a further object of the present invention to provide a method of managing a sequence of reading and writing data in a storage system.

SUMMARY OF THE INVENTION

The above objects have been achieved with a system and method for managing a sequence of writing data to non-volatile memory cells in an integrated circuit device with flag cells storing data indicating the sequence of reading and writing such that with each successive write operation, new data is written to and currently stored data is read from an alternate non-volatile memory cell, as compared to the last operation. A plurality of non-volatile memory cells, associated with a plurality of flag cells, is used in the present invention to increase the endurance of a non-volatile memory cell. For instance two, three or more non-volatile memory cells associated with two, three or more flag cells, may be used.

In one example, disposed on the integrated circuit are a pair of non-volatile memory cells with associated first and second flag cells. The pair of non-volatile memory cells function as a single larger memory cell with twice the endurance of a regular single non-volatile memory cell. The managing data of the first flag cell and the managing data of the second flag cell form a data set. A current data set is utilized to determine to which memory cell of the pair of memory cells to write a new value and from which of the pair of memory cells to read a currently stored value. The current data set is changed to a different data set whenever a new value is written to a designated memory cell to indicate an alternate memory cell to be written to next and an alternate memory cell to be read from next.

The different data set becomes the current data set and is used to determine to which non-volatile memory cell to write a new value and from which non-volatile memory cell to read a currently stored value with each successive write operation. A number of different data sets are cycled through to indicate from which alternate cell to next read and to which alternate cell to next write.

The current data set may be changed by either writing new management data to one of the flag cells or erasing management data from a flag cell to which data has already been written. In one example, the data set is changed by alternately writing a new value to a flag cell in each successive change of the data set. Thus, the wear of the flag cell is substantially level and at substantially the same rate as the associated pair of memory cells.

In operation, the current data set has logic values which are input into logic control means, such as logic control circuitry, forming a part of the integrated circuit to determine to which memory cell to write new data and from which memory cell to read data. Logic control means also determine from the current data set the logic values to which the data set should be changed after each successive write/erase cycle. The memory cells and flag cells are programmed with program circuitry known in the art and according to the determination of the logic control means. With each successive write operation to an alternate non-volatile memory cell, logic control means change the current data set to a different data set which becomes the current data set so that an alternate memory cell is read to and written from.

BRIEF DESCRIPTION OF THE DRAWINGS

FIG. 3A is a diagram of an embodiment of a multiplexer of the storage system of the present invention.

FIG. 3C is a table of data set logic values, inputted into and/or derived from the logic control circuitry of FIG. 3B, indicating from which non-volatile memory cell to read a current value and to which non-volatile memory cell to write a new value.

FIG. 3D is a diagram of an inverter used in conjunction with the logic control circuitry of FIG. 3B.

FIG. 3E is a diagram of another inverter used in conjunction with the logic control circuitry of FIG. 3B.

DETAILED DESCRIPTION OF THE INVENTION

Figure 1:
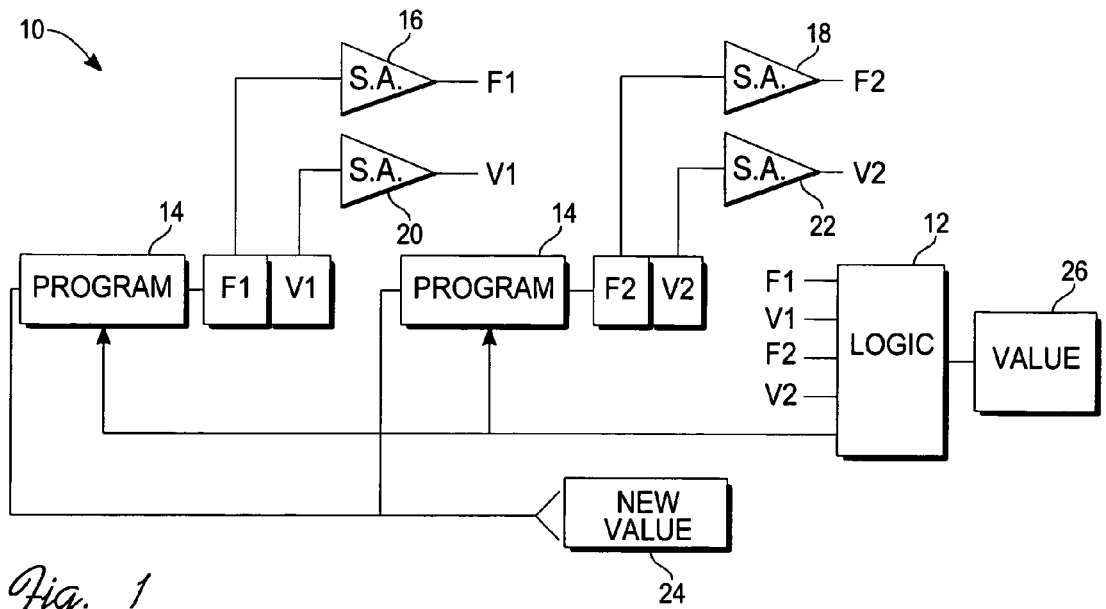
FIG. 1 is a diagram of a storage system of an integrated circuit according to the present invention.

With reference to FIG. 1, the storage system 10 of the present invention features an integrated circuit comprising logic control means, such as logic control circuitry 12, a pair of non-volatile memory cells V1 and V2, a pair of flag cells F1 and F2 associated with the pair of memory cells, and program control means, such as program control circuitry 14, to program the flag cells and non-volatile memory cells. Though the present invention will be described with regard to two non-volatile memory cells associated with two flag cells, various numbers of non-volatile memory cells and associated flag cells may be used to accomplish alternate reading from and writing to non-volatile memory cells. For instance, a plurality of non-volatile memory cells, including two, three or more non-volatile memory cells, with an associated plurality of flag cells may be used to increase the endurance of the non-volatile memory cells by a factor of two, three or more. The flag cells are for example, memory cells, and are preferably, non-volatile memory cells so that the last data set of each of the flag cells may be recalled. Logic control circuitry utilizes managing data stored within the flag cells to determine to which one of two non-volatile memory cells, V1 or V2, to write a new value 24 and from which other of the two non-volatile memory cells, V1 or V2, to read a currently stored value 26. Logic control circuitry 12 utilizes managing data stored within the flag cells F1 and F2 to determine how to change the value of each flag cell whenever a new value is written to a designated non-volatile memory cell. Program circuitry 14 is used to program the non-volatile memory cells and flag cells according to the flag cell managing data utilized by the logic control circuitry such that data is alternately written to and read from the non-volatile memory cells V1 and V2. Managing data includes logic or binary values providing signals to the logic control circuitry.

Still referring to FIG. 1, sense amplifier 16 is associated with flag cell F1, sense amplifier 18 is associated with flag cell F2, sense amplifier 20 is associated with non-volatile memory cell V1 and sense amplifier 22 is associated with non-volatile memory cell V2 to sense the output of each F1, F2, V1 and V2 cell. A sense signal may be toggled to initialize the system after new value 24 has been written to the designated non-volatile memory cell and after the current data set has been changed to update each flag cell and non-volatile memory cell.

Figure 2:
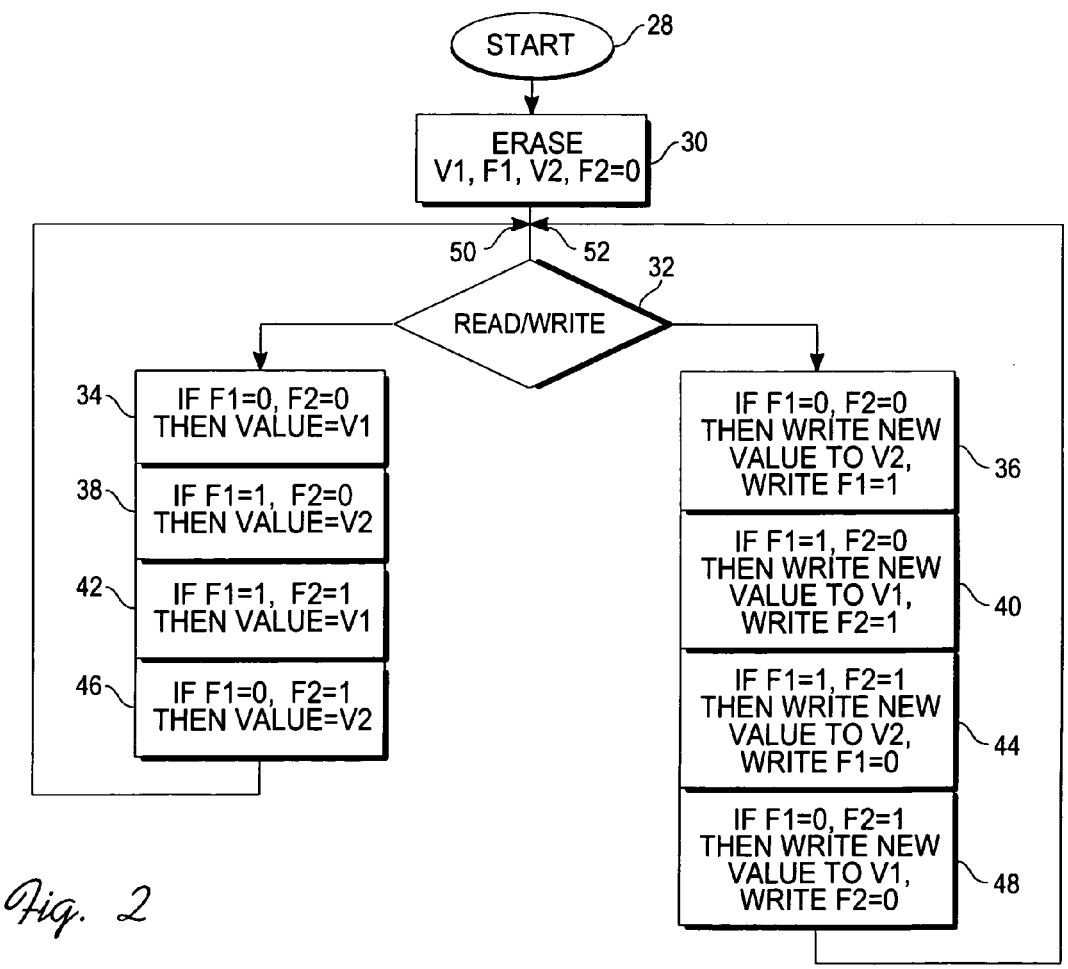
FIG. 2 is a logic flow diagram of an embodiment of the present invention.

With reference to FIGS. 1 and 2, one embodiment of the method of the present invention is seen. In FIG. 1, after start step 28 of the operation, flag cell F1 flag cell F2, non-volatile memory cell V1 and non-volatile memory cell V2 are erased to 0 as shown in step 30. The managing data of flag cell F1 and flag cell F2 form a data set which is used, as shown in block 32, to determine from which memory cell to read a currently stored value and to which memory cell to write a new value. In this example, as the flag cells have been erased, the first data set includes the logic values of F1=0 and F2=0 which are input into logic control circuitry 12 and which become the current data set. The logic control circuitry, from the first data set, determines to read a currently stored value from non-volatile memory cell V1, as shown in block 34. When a new value 24 is written to one of the non-volatile memory cells, the logic control circuitry 12, from the first data set, determines to write the new value to non-volatile memory cell V2, as shown in block 36. When the new value is written by the program control circuitry 14 to the designated non-volatile memory cell V2, the logic control circuitry 12 determines from the first data set, a second data set that is different from the first data set to which to change the first data set. Accordingly, the program circuitry writes a 1 to flag cell F1, as shown in block 36. Flag cell F2 is erased or neither a write or erase function is asserted to the flag cell F2, leaving the logic value as 0.

The logic values of F1=1 and F2=0, the next or second data set, are input into logic control circuitry 12 and become the current data set. The logic control circuitry 12 determines from the second data set to read the currently stored value from non-volatile memory cell V2, as shown in block 38. When a new value 24 is written to one of the pair of non-volatile memory cells, the logic control circuitry 12, from the second data set, determines to write the new value to non-volatile memory cell V1 as shown in block 40. When the new value is written by the program control circuitry 14 to the designated non-volatile memory cell V1, the logic control circuitry 12 utilizes the second data set to determine a third data set that is different from the second data set to which to change the second data set. In this example, the next or third, different data set is determined to include the logic values F1=1 and F2=1. Therefore, with regard to flag cell F1, neither an erase or write function is asserted, leaving the value as 1. Alternatively, flag cell F1 could be erased and have a 1 written to it. With regard to flag cell F2, the program circuitry writes a 1 to flag cell F2, as shown in block 40. The logic values of F1=1 and F2=1, the third data set, are input into logic control circuitry and become the current data set.

The logic control circuitry determines from the third data set to read a currently stored value from non-volatile memory cell V1, as shown in block 42. When a new value 24 is written to one of the pair of non-volatile memory cells, the logic control circuitry 12, utilizes the third data set to determine to write the new value to non-volatile memory cell V2, as shown in block 44. When the new value is written by the program control circuitry 14 to the designated non-volatile memory cell V2, the logic control circuitry utilizes the third data set to determine a fourth data set that is different from the third data set which to change the third data set to. In this example, the next or fourth, different data set is determined to include logic values of F1=0 and F2=1. Therefore, flag cell F1 is erased (or written to 0), as shown in block 44. With regard to flag cell F2, neither the erase or write function is asserted leaving the value as 1. Alternatively, flag cell F2 could be erased and have a 1 written to it. The logic values of F1=0 and F2=1, the fourth data set, are input into logic control circuitry 12 and become the current data set.

The logic control circuitry determines from the fourth data set to read the currently stored value from non-volatile memory cell V2, as shown in block 46. When a new value 24 is written to one of the pair of non-volatile memory cells, the logic control circuitry, from the fourth data set determines to write a new value to non-volatile memory cell V1, as shown in block 48. When a new value is written, the logic circuitry determines from the fourth data set another data set to next become the current data set. For example, the first data set, different from the fourth data set, indicates the alternate non-volatile memory cell to be read from next and the alternate non-volatile memory cell to be written to next. In block 48, memory cell F2 is erased (or written to 0). With regard to memory cell F1, an erase function is asserted or, neither the erase or write function is asserted, thus leaving the value as 0. Therefore the resulting next data set includes the logic values of F1=0 and F2=0. These values are the same as the first data set values.

The steps of inputting different data sets as described above may be repeated as shown by arrows 50 and 52 and the data set values (for example, F1=0 and F2=0; F1=1 and F2=0; F1=1 and F1=1; F1=0 and F2=1) cycled through so that the program circuitry is continuously programmed to write data to an alternate non-volatile memory cell whenever a new value is written and so that data is read from an alternate non-volatile memory cell.

In one embodiment of the present invention, before each non-volatile memory cell has the new value written to it, as described above or in other embodiments, program circuitry 14 performs an erase operation to the non-volatile memory cell to which the new value will be written. In other words, the erase function is coupled to the write function and occurs before the write function.

In one embodiment, managing data is alternately written to the flag cells and alternately erased from the flag cells as the data sets are changed. Thus, as the data sets of the flag cells are cycled through, the wear of the flag cells is substantially level and at substantially the same rate as the associated pair of memory cells.

In one embodiment, the group of different data sets is equally divided in number between those current data sets indicating to write a new value to non-volatile memory cell V1 and between those current data sets indicating to write a new value to non-volatile memory cell V2.

Referring to FIG. 3A, an example of a multiplexer 54 is seen which utilizes one of four flag cell data sets to determine from which non-volatile memory cell, V1 or V2, to read a currently stored value. In this example, the four data sets include logic values as follows: F1=0 and F2=0; F1=0 and F2=1; F1=0 and F2=1; and F1=1 and F2=0. A DATA_OUT value is read from only one of the memory cells V1 and V2 each time a different data set is input into the multiplexer 54. In this example, when the current data sets are F1=0 and F2=0 or F1=1 and F2=1 then the currently stored value of V1 is read as DATA_OUT. Also, in this example, when the current data sets are F1=0 and F2=1 or F1=1 and F2=0 then the currently stored value of V2 is read as DATA_OUT.

Figure 3B:
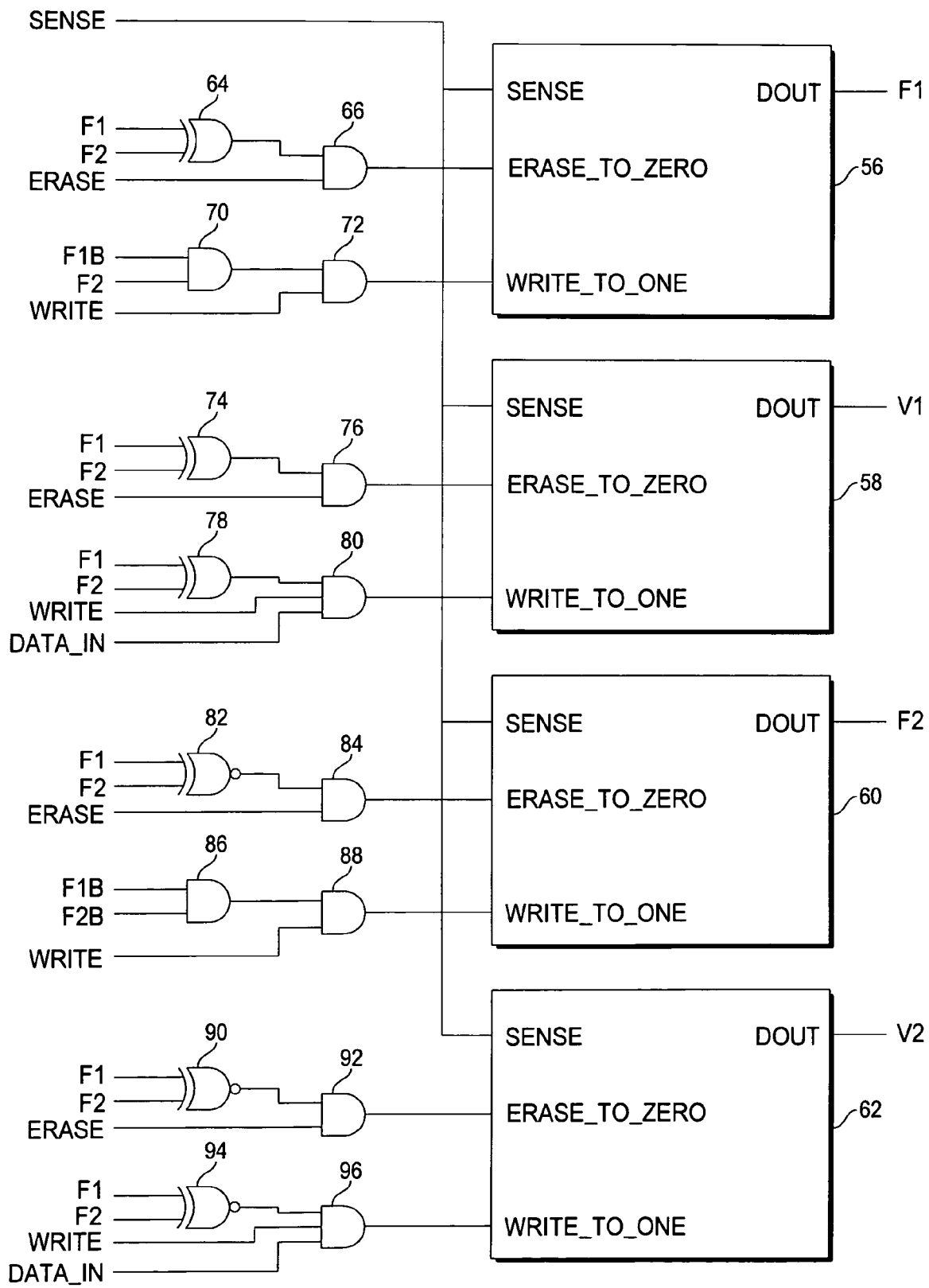
FIG. 3B is a logic control circuitry diagram illustrating an embodiment of the present invention.

Referring to FIG. 3B, an embodiment of the logic control circuitry of the present invention is shown. This embodiment utilizes the four different data sets shown in FIG. 3A and FIG. 3C. The logic control circuitry of non-volatile memory cells V1 and V2 and flag cells F1 and F2 is depicted with input/output blocks 56, 58, 60, and 62 corresponding to flag cell F1, non-volatile memory cell V1, flag cell F2, and non-volatile memory cell V2, respectively, and electrically connected to various logic gates. Each of the input/output blocks for cells F1, V1, F2, and V2 are configured to receive specific input signals through various logic gates.

Specifically, F1 and F2 managing data signals are coupled together through XOR gate 64, the output of which becomes one of the inputs of AND gate 66 connected to input/output block 56 for flag cell F1. An ERASE signal is the other input of the AND gate 66. If the output of the AND gate 66 is 1, the F1 input/output block 56 will erase to zero, as shown by the ERASE_TO_ZERO function. If a 1 is not asserted, it will not erase to 0. Inverter 68 is shown in FIG. 3D inverting signal F1 to F1B. Signal F1B and signal F2 are inputs for AND gate 70, the output of which is an input of AND gate 72. A WRITE signal is another input of AND gate 72. If the output of the AND gate 72 is 1, the F1 input/output block 56 will write to one, as shown by the WRITE_TO_ONE function. If a 1 is not asserted, it will not write to 1. If neither the erase or write functions are asserted, the value within the input/output block 56 will remain the same. The erase and write functions are asserted sequentially.

F1 and F2 managing data signals are coupled together through XOR gate 74, the output of which becomes one of the inputs of AND gate 76 connected to input/output block 58 for memory cell V1. An ERASE signal is the other input of the AND gate 76. If the output of the AND gate 76 is 1, the V1 input/output block 58 will erase to zero, as shown by the ERASE_TO_ZERO function. If a 1 is not asserted, it will not erase to 0. Data signals F1 and F2 are inputs for XOR gate 78, the output of which is an input of AND gate 80. A WRITE signal and a DATA_IN signal are also inputs of the AND gate 80. If the output of the AND gate is 1 the F1 input/output block will write to one, as shown by the WRITE_TO_ONE function. If a 1 is not asserted, it will not write to 1. If neither the erase or write functions are asserted the value within the input/output block 58 of V1 will remain the same. The erase and write functions are asserted sequentially.

F1 and F2 management data signals are coupled together through an XNOR gate 82, the output of which becomes one of the inputs of AND gate 84 connected to input/output block 60 for flag cell F2. An ERASE signal is the other input of the AND gate 84. If the output of the AND gate 84 is 1, the F2 input/output block 60 will erase to zero, as shown by the ERASE_TO_ZERO function. If a 1 is not asserted, it will not erase to 0. Inverter 81 is shown in FIG. 3E inverting signal F2 to F2B. Data signals F1B and F2B are inputs of AND gate 86, the output of which is an input of AND gate 88. A WRITE signal is also an input of the AND gate 88. If the output of the AND gate 88 is 1 the F1 input/output block 60 will write to one, as shown by the WRITE_TO_ONE function. If a 1 is not asserted, it will not write to 1. If neither the erase or write functions are asserted, the value within the input/output block F2 will remain the same. The erase and write functions are asserted sequentially.

F1 and F2 management data signals are coupled together through XNOR gate 90, the output of which becomes one of the inputs of AND gate 92 connected to input/output block 62 for memory cell V2. An ERASE signal is the other input of AND gate 92. If the output of the AND gate 92 is 1, the V2 input/output block 62 will erase to zero, as shown by the ERASE_TO_ZERO function. If a 1 is not asserted, it will not erase to 0. Data signals F1 and F2 are inputs for XNOR gate 94, the output of which is an input of AND gate 96. A WRITE signal and DATA_IN signal are also inputs of the AND gate 96. If the output of the AND gate 96 is 1 the F1 input/output block 62 will write to one, as shown by the WRITE_TO_ONE function. If a 1 is not asserted, it will not write to 1. If neither the erase or write functions are asserted the value within the input/output block V2 will remain the same. The erase and write functions are asserted sequentially.

With reference to FIG. 3C, a table shows an example of a sequence of logic values of the flag cell data sets that may be used with and are derived from the configuration of the logic control circuitry of FIG. 3B. The "Current" F1 and F2 values from the table and the derived F1B and F2B values are input into the appropriate logic gates when a new value is written to one of the non-volatile memory cells.

A current data set has logic values of F1=0 and F2=0, as shown in the "Current" column of the table of FIG. 3C. The flag cells may have been erased to zero or may currently be zero. Referring also to FIG. 3B, when a new value is written to one of the pair of non-volatile memory cells, at input/output block 56 for flag cell F1 and input/output block 58 for memory cell V1, the outputs of the XOR gates 64, 74 and 78 and AND gate 70 are 0. Therefore, the output of the AND gates 66, 72, 76, and 80 must also be 0. Accordingly, neither the erase or write functions of cells F1 and V1 are asserted. The currently stored value of non-volatile memory cell V1 is "Read from" cell V1, as shown in FIG. 3C. This value may be 0 if the non-volatile memory cells were erased previously or stored a value of 0 previously. The stored value of 0 is read as DOUT for input/output block 56 for flag cell F1 (FIG. 3B).

At input/output block 60 for flag cell F2, a 1 is an output of XNOR gate 82 and AND gate 86 and thus a 1 is an input for the AND gates 84 and 88. Therefore, the erase and write functions may be asserted, though not simultaneously. The WRITE signal is a 1 which asserts the WRITE_TO_ONE function. Therefore, a 1 is written to the flag cell F2 as shown by the "Next" column of FIG. 3C. The stored value becomes DOUT for input/output block 60 for flag cell F2 (FIG. 3B).

At input/output block 62 for memory cell V2, a 1 is the output of XNOR gates 90 and 94 and thus a 1 is an input for the AND gates 92 and 96. Therefore, the erase and write functions may be asserted, though not simultaneously. The block V2 may be erased before writing, although since it is already at 0, erasing is not necessary. The WRITE signal is a 1 which asserts the WRITE_TO_ONE function. DATA_IN, or the new value, is written to the memory cell V2 as shown by the "Erase/Write to" column of FIG. 3C. This value becomes DOUT for input/output block 62 for memory cell V2.

The "Next" data set becomes the "Current" data set having the logic values of F1=0 and F2=1, as derived above and as shown in the table of FIG. 3C. These logic values and the derived F1B and F2B logic values are input into the logic gates for the various input/output blocks, when a new value is written to one of the pair of non-volatile memory cells. When a new value is written, at input/output blocks F1 and V1, 56 and 58, respectively, a 1 is the output of AND gate 70, and XOR gates 64, 74 and 78, thus a 1 is an input of the AND gates 66, 72, 76 and 80. Therefore, the erase and write functions may be asserted in flag cell F1 and memory cell V1, though not simultaneously in each cell. The WRITE signal of flag cell F1 is a 1 which asserts the WRITE_TO_ONE function. Therefore, a 1 is written to the flag cell F1, as shown by the "Next" column of FIG. 3C. The 1 becomes DOUT for input/output block 56 for flag cell F1 (FIG. 3B). The input/output block 58 for V1 may be erased before writing, although since it is already at 0, this is not necessary. The WRITE signal is a 1 which asserts the WRITE_TO_ONE function. DATA_IN, or the new value, is written to the memory cell V1, as shown by the "Erase/Write to" column of FIG. 3C. The new value becomes DOUT for V1.

At input/output blocks 60 and 62 for cells F2 and V2, respectively, the outputs of the XNOR gates 82, 90 and 94 and AND gate 86 are 0. Therefore, the output of the AND gates 84, 88, 92, and 96 must also be 0. Accordingly, neither the erase or write functions may be asserted and the values within the F2 and V2 cells remain the same. The currently stored value of non-volatile memory cell V2 is "Read from" cell V2, as shown in FIG. 3C. The DOUT of input/output block 60 for flag cell F2 remains 1 (FIG. 3B).

The "Next" data set becomes the "Current" data set having the logic values of F1=1 and F2=1, as derived above and as shown in the table of FIG. 3C. These values and the derived F1B and F2B values are input into the logic gates for the various input/output blocks when a new value is written to one of the non-volatile memory cells. When a new value is written, at input/output blocks 56 and 58 for cells F1 and V1 the outputs of the XOR gates 64, 74 and 78 and AND gate 70 are 0. Thus, the outputs for the AND gates 66, 72, 76 and 80 must also be 0. Accordingly, neither the erase or write functions are asserted and the values remain the same. The currently stored value of non-volatile memory cell V1 is "Read from" cell V1, as shown in FIG. 3C. The output DOUT of input/output block 56 for flag cell F1 remains 1 (FIG. 3B).

At input/output blocks 60 and 62 for cells F2 and V2, respectively, a 1 is the output of XNOR gates 82, 90 and 94, thus a 1 is an input for the AND gates 84, 92 and 96. The output of AND gate 86 is 0, thus the output of AND gate 88 is 0. Therefore, for input/output block 60 the erase function may be asserted. For input/output block 62, the write and erase functions may be asserted. The input/output block 60 for flag cell F2 is erased with an ERASE signal to assert the ERASE_TO_ZERO function, as shown in FIG. 3B, but a WRITE signal is not asserted. Therefore, the flag cell F2 is erased to 0, as shown by the "NEXT" column of FIG. 3C. The output DOUT of input/output block 60 for flag cell F2 is 0 (FIG. 3B). The input/output block 62 for cell V2 is erased before writing, since it already includes the previous DATA_IN value. Therefore, the erase function is asserted as shown by FIG. 3B, with an ERASE signal, and the "Erase/Write to" column of FIG. 3C. Next, the WRITE signal, having a value of 1, is applied to the AND gate 96 and DATA_IN thereby asserting the WRITE_TO_ONE function. DATA_IN, or the new value is written to the memory cell V2, as shown by the "Erase/Write to" column of FIG. 3C. The new value becomes DOUT for input/output block 62 for memory cell V2 (FIG. 3B).

The "Next" data set becomes the "Current" data set having the logic values of F1=1 and F2=0, as derived above and as shown in the table of FIG. 3C. These values and the derived F1B and F2B values are input into the gates for the various input/output blocks when a new value is written to one of the non-volatile memory cells. When a new value is written, at input/output blocks 56 and 58 for cells F1 and V1 a 1 is the output of the XOR gates 64, 74, and 78 and thus a 1 is an input for the AND gates 66, 76 and 80. A value of 0 is the output of AND gate 70, thus a 0 is the output of AND gate 72. Therefore, the block F1 is erased by asserting an ERASE signal but a WRITE signal is not asserted. The flag cell F1 is erased to 0 as shown by the "NEXT" column of FIG. 3C. The output DOUT of input/output block 56 of flag cell F1 is 0. The input/output block 58 for cell V1 is erased before writing, since it already includes the previous DATA_IN value. The ERASE signal, as shown in FIG. 3B, is asserted to assert the ERASE_TO_ZERO function. Next, the WRITE signal, having a value of 1, is applied to the AND gate 80 and the WRITE_TO_ONE function is asserted. DATA_IN, or the new value, is written to the memory cell V1 as shown by the "Erase/Write to" column of the table of FIG. 3C. The new value becomes DOUT of input/output block 58 for memory cell V1 (FIG. 3B).

At input/output blocks 60 and 62 for cells F2 and V2 the outputs of the XNOR gates 82, 90 and 94 and AND gate 86 are 0. Accordingly, neither the erase or write functions may be asserted and the values remain the same. A currently stored value is "Read from" input/output block 62 of cell V2, as shown in FIG. 3C. The output DOUT of input/output block 60 of flag cell F2 remains 0.

The "Next" data set becomes the "Current" data set having the logic values of F1=0 and F2=0, as derived above and as shown in the table of FIG. 3C. The method is repeated each time a new value is written to one of the non-volatile memory cells. The current data set having data managing signals and, inverse, ERASE, WRITE, and DATA_IN signals are input as described above resulting in a different next data set. As seen in FIG. 3C, the data set values are input sequentially, as determined by the logic control circuitry, to alternately read to and write from non-volatile memory cells. Once all of the data set values have been cycled through, the first data set in a series is again used to determine from which alternate memory cell to read from and write to as indicated by the "Next" column of FIG. 3C.

A SENSE signal (FIG. 3B) may be toggled to initialize the system, after a new value has been written to the designated non-volatile memory cell to update each memory cell, and after the current data set has been changed to update each flag cell.

In one embodiment of the present invention, an erase recovery operation may be performed. To recover a value from one of the non-volatile memory cells before it is erased and a new value is written to it, the data set is advanced to a data set after the next sequential data set in a sequence of data sets. For, example with reference to FIG. 3C, assuming that the data set F1=0 and F2=0 was the current data set, then the value would be read from non-volatile memory cell V1. If the logic control circuitry advanced the data set to F1=1 and F2=1, instead of to F1=0 and F2=1 which is the "Next" data set in the sequence, the value of V1 would be recovered from the erase operation it would have undergone had the data set been advanced to F1=0 and F2=1.

What we claim is:

1. A storage system comprising:
   a plurality of non-volatile memory cells in an integrated circuit, the plurality of non-volatile memory cells associated with a plurality of flag cells;
   means for establishing a current data set including managing data stored in said plurality of flag cells, said current data set indicating which one of said plurality of non-volatile memory cells to write a new value to and which other of said plurality of non-volatile memory cells to read a currently stored value from; and
   means for changing said current data set whenever a new value is written to an indicated non-volatile memory cell to indicate an alternate memory cell to be written to next and an alternate memory cell to be read from next.

2. The storage system according to claim 1 including first and second non-volatile memory cells and first and second flag cells associated with said first and second non-volatile memory cells.

3. The storage system according to claim 2 wherein said means for changing said current data set includes means for alternately changing managing data in said first and second flag cells.

4. The storage system according to claim 2 wherein said means for changing said current data set includes means for alternately writing managing data to one of said flag cells.

5. The storage system according to claim 2 wherein said means for changing said current data set includes means for alternately erasing managing data from one of said flag cells.

6. The storage system according to claim 2 wherein said means for changing said current data set includes means for writing managing data to one of said flag cells.

7. The storage system according to claim 2 wherein said means for changing said current data set includes means for erasing managing data from one of said flag cells.

8. The storage system according to claim 2 wherein said managing data stored in said first flag cell includes a logic value of 0 or 1 and said managing data stored in said second flag cell includes a logic value of 0 or 1.

9. The storage system according to claim 8 wherein said current data set is selected from a group of data sets consisting of a first data set including managing data of 0 stored in said first flag cell and 0 stored in said second flag cell; a second data set including managing data of 0 stored in said first flag cell and 1 stored said second flag cell; a third data set including managing data of 1 stored in said first flag cell and 1 in said second flag cell; and a fourth data set including managing data of 1 stored in said first flag cell and 0 in said second flag cell.

10. The storage system according to claim 9 wherein said current data set is said first data set.

11. The storage system according to claim 10 wherein said means for changing said first data set includes means for changing said first data set to said second, third and fourth data sets, respectively.

12. The storage system according to claim 10 wherein said means for changing said current data set includes means for repeatedly changing said current data set.

13. The storage system according to claim 12 wherein said means for changing said current data set includes means for cyclically changing said current data set.

14. The storage system according to claim 2 further comprising means for writing said new value to one of said first and second non-volatile memory cells and means for reading said currently stored value from the other of said first and second non-volatile memory cells.

15. The storage system according to claim 2 further comprising means for erasing one of said non-volatile memory cells.

16. The storage system according to claim 2 wherein said current data set is included in a group of different current data sets and said means for changing said current data set further include means for changing said current data set to one of said group of different current data sets.

17. The storage system according to claim 16 wherein said group of different current data sets is equally divided in number between those current data sets indicating writing said new value to said first non-volatile memory cell and between those current data sets indicating writing said new value to said second non-volatile memory cell.

18. The storage system according to claim 17 wherein said means for changing said current data set includes means for changing said current data set to a different one of said group of different current data sets each time said current data set is changed.

19. The storage system according to claim 16 wherein said means for changing said current data set includes means for changing said data set to a different one of said group of different current data sets each time said current data set is changed.

20. The storage system according to claim 1 wherein said means for changing said current data set includes means for repeatedly changing said current data set.

21. The storage system according to claim 20 wherein said means for changing said current data set includes means for cyclically changing said current data set.

22. The storage system according to claim 1 wherein said managing data of said plurality of flag cell is a logic value.

23. The storage system according to claim 1 further comprising means for reading said current data set.

24. The storage system according to claim 1 wherein said plurality of flag cells are memory cells.

25. The storage system according to claim 1 wherein said means for changing said current data set includes logic control means.

26. The storage system according to claim 1 wherein said plurality of non-volatile memory cells includes two non-volatile memory cells.

27. A method of managing a sequence of reading and writing in a storage system including an integrated circuit having a plurality of non-volatile memory cells and a plurality of flag cells storing managing data, said managing data of said plurality of flag cells forming a current data set, comprising the steps of:
 a) utilizing said current data set to determine which one of said plurality of non-volatile memory cells to write a new value to and which other of said plurality of non-volatile memory cells to read a currently stored value from;
 b) reading said currently stored value of said one of said plurality of memory cells according to said current data set;
 c) writing said new value to said other of said plurality of non-volatile memory cells according to said current data set and changing said current data set to a different current data set whenever a new value is written;
 d) utilizing said different current data set to determine which one of said plurality of non-volatile memory cells to write another new value to and which other of said plurality of non-volatile memory cells to read another currently stored value from;
 e) writing another new value to an alternate non-volatile memory cell according to said different current data set; and
 f) reading another currently stored value from an alternate non-volatile memory cell according to said different current data set.

28. The method according to claim 27 further comprising repeating steps c)–f) wherein said different current data set becomes said current data set.

29. The method according to claim 28 including first and second flag cells and first and second non-volatile memory cells.

30. The method according to claim 29 wherein changing said current data set includes alternately writing managing data to said first and second flag cells.

31. The method according to claim 29 wherein changing said current data includes alternately erasing managing data from said first and second flag cells on which data has been written.

32. The method according to claim 29 wherein changing said current data set includes writing managing data to one of said first and second flag cells.

33. The method according to claim 29 wherein changing said current data set includes erasing management data from said one of said first and second flag cells which has had data written to it.

34. The method according to claim 29 further comprising erasing both of said first and second flag cells before step a) occurs.

35. The method according to claim 34 wherein changing said current data set includes writing managing data to said second flag cell.

36. The method according to claim 35 further comprising repeating steps c)–f) wherein said different current data set becomes said current data set and wherein changing said current data set includes writing managing data to said first flag cell.

37. The method according to claim 36 further comprising repeating steps c)–f) wherein said different current data set becomes said current data set and wherein changing said current data set includes erasing managing data from said second flag cell.

38. The method according to claim 37 further comprising repeating steps c)–f) wherein said different current data set becomes said current data set and wherein changing said current data set includes erasing managing data from said first flag cell.

39. The method according to claim 29 wherein changing said current data set includes writing new managing data to or erasing currently stored managing data from one of said first and second flag cells.

40. The method according to claim 29 further comprising repeating steps c)–f) wherein said different current data set becomes said current data set and wherein changing said current data set includes writing managing data to one of said flag cells an equal number of times as said other flag cell.

41. The method according to claim 29 further comprising repeating steps c)-f) wherein said different current data set becomes said current data set and wherein changing said current data set includes writing managing data alternately to said flag cells.

42. The method of claim 29 further comprising changing said current data set to a different current data set from a group of different current data sets.

43. The method according to claim 42 further comprising equally dividing said group of different current data sets in number between those different current data sets indicating writing a new value to said first non-volatile memory cell and between those different current data sets indicating writing a new value to said second non-volatile memory cell.

44. The method according to claim 43 further comprising repeating steps c)–f) wherein said different current data set becomes said current data set and changing said current data set data to one of said group of different current data sets sequentially.

45. The method according to claim 44 further comprising changing said current data set to one of said group of different current data sets of said group of different current data sets cyclically.

46. The method according to claim 42 further comprising repeating steps c)–f) wherein said different current data set becomes said current data set and changing said current data set to one of said group of different current data sets an equal number of times as the current data set is changed to the other different current data sets upon repeating steps c)–f) the same number of times as there are different current data sets.

47. The method according to claim 29 wherein said current data set and said different current data set are selected from a group of current data sets consisting of a first data set storing logic values of 0 in said first flag cell and 0 in said second flag cell; a second data set storing logic values of 0 in said first flag cell and 1 in said second flag cell; a third data set storing logic values 1 in said first flag cell and 1 in said second flag cell; and a fourth data set storing logic values of 1 in said first flag cell and 0 in said second flag cell.

48. The method according to claim 47 wherein said current data set is said first data set and said different data set is said second data set.

49. The method according to claim 48 further comprising repeating steps c)–f) wherein said second data set is said current data set and said third data set is said different data set.

50. The method according to claim 49 further comprising repeating steps c)–f) wherein said third data set is said current data set and said fourth data set is said different data set.

51. The method according to claim 50 further comprising repeating steps c)–f) wherein said fourth data set is said current data set and said first data set is said different data set.

52. A method of managing a sequence of reading and writing in a storage system including an integrated circuit having a plurality of non-volatile memory cells and a plurality of flag cells storing managing data, said managing data of said plurality of flag cells forming a current data set said, comprising the steps of:
  a) utilizing said current data set to determine which one of said plurality of non-volatile memory cells to write a new value to and which other of said plurality of non-volatile memory cells to read a currently stored value from;
  b) reading said currently stored value of said other of said plurality of memory cells according to said current data set; and
  c) writing said new value to said one of said plurality of non-volatile memory cells according to said current data set and changing said current data set to a different current data set.

53. The method according to claim 52 further comprising repeating steps a)–c) wherein said different data set becomes said current data set.

54. The method according to claim 52 further comprising erasing said plurality of flag cells before step a).

55. The method according to claim 52 further comprising erasing said plurality of non-volatile memory cells before step a).

56. The method according to claim 52 wherein changing said current data set includes writing managing data to one of said plurality of flag cells.

57. The method according to claim 52 wherein changing said current data set includes erasing managing data from one of said plurality of flag cells to which data has been written.

58. The method according to claim 52 further comprising providing a sequence of data sets and changing said data set to a data set after the next data set in the sequence.

* * * * *